United States Patent [19]

Meinel

[11] Patent Number: 4,777,465
[45] Date of Patent: Oct. 11, 1988

[54] SQUARE TOROID TRANSFORMER FOR HYBRID INTEGRATED CIRCUIT

[75] Inventor: Walter B. Meinel, Tucson, Ariz.

[73] Assignee: Burr-Brown Corporation, Tucson, Ariz.

[21] Appl. No.: 882,071

[22] Filed: Jul. 2, 1986

Related U.S. Application Data

[63] Continuation-in-part of Ser. No. 856,720, Apr. 28, 1986.

[51] Int. Cl.⁴ .................. H01F 15/02; H01F 27/30
[52] U.S. Cl. ........................ 336/65; 29/606; 336/200; 336/223; 336/229
[58] Field of Search .............. 336/200, 223, 229, 184, 336/221, 225, 183, 65; 29/606

[56] References Cited

U.S. PATENT DOCUMENTS

| | | | |
|---|---|---|---|
| 1,801,214 | 4/1931 | Von Henke . | |
| 3,040,184 | 6/1962 | Dillon, Jr. ..................... | 307/88 |
| 3,104,377 | 9/1963 | Alexander et al. ............... | 340/173.2 |
| 3,192,495 | 6/1965 | Brodersen ..................... | 336/135 |
| 3,353,132 | 11/1967 | D'Entremont ..................... | 336/155 |
| 3,372,358 | 3/1968 | Roy et al. ..................... | 336/200 |
| 3,668,589 | 6/1972 | Wilkinson ..................... | 336/212 |
| 3,675,095 | 7/1972 | Lehmann ..................... | 317/261 |
| 3,742,408 | 6/1973 | Jaeger ..................... | 336/5 |
| 3,764,938 | 10/1973 | Barnes ..................... | 331/96 |
| 3,874,075 | 4/1975 | Lohse ..................... | 29/602 |
| 4,103,267 | 7/1978 | Olschewski ..................... | 336/65 |
| 4,188,651 | 2/1980 | Dornfeld et al. ..................... | 361/322 |
| 4,249,229 | 2/1981 | Hester ..................... | 361/399 |
| 4,325,045 | 4/1982 | Mehl ..................... | 336/197 |
| 4,455,545 | 6/1984 | Shelly ..................... | 336/200 |
| 4,504,813 | 3/1985 | Strang ..................... | 336/216 |

FOREIGN PATENT DOCUMENTS

| | | |
|---|---|---|
| 2556493 | 6/1985 | France ..................... 336/183 |
| 36716 | 3/1956 | Fed. Rep. of Germany ...... 336/229 |
| 1197561 | 7/1965 | Fed. Rep. of Germany . |
| 2723363 | 11/1978 | Fed. Rep. of Germany . |
| 4822737 | 5/1973 | Japan . |
| 811295 | 4/1959 | United Kingdom . |
| 1469944 | 4/1977 | United Kingdom . |

Primary Examiner—Thomas J. Kozma
Attorney, Agent, or Firm—Cahill, Sutton & Thomas

[57] ABSTRACT

A square toroid transformer is assembled on a ceramic hybrid integrated circuit substrate. The primary and secondary windings of the transformer are provided on opposite arms of a square toroid ferrite core by providing first and second groups of spaced, parallel metal conductors on the surface of the ceramic substrate and adherent thereto, and an insulative layer over the first and second groups of conductors, leaving their respective end portions exposed. The square toroid ferrite core, coated with dielectric material, is attached to the insulative layer. Wire bonds in planes perpendicular to the longitudinal axes of the opposite arms each are wire bonded, respectively, to an inner end of one of the metal conductors and an outer end of an adjacent one. A large number of turns for both the primary winding and the secondary winding are achieved, resulting in high primary and secondary winding and inductances, while maintaining a uniform separation and high breakdown voltage between the primary and secondary wirings.

6 Claims, 2 Drawing Sheets

SQUARE TOROID TRANSFORMER FOR HYBRID INTEGRATED CIRCUIT

CROSS-REFERENCE TO RELATED APPLICATION

This application is a continuation-in-part of commonly assigned copending patent application, Ser. No. 856,720, entitled "PACKAGES FOR HYBRID INTEGRATED CIRCUIT HIGH VOLTAGE ISOLATION AMPLIFIERS AND METHOD OF MANUFACTURE", by Walter B. Meinel, filed on Apr. 28 1986.

BACKGROUND OF THE INVENTION

The invention relates to hybrid integrated circuit transformers utilizing both printed conductors on a substrate and wire bonding loops to form primary and secondary windings about a unitary toroidal core and more particularly to such a transformer having a square toroidal core.

Commonly assigned U.S. Pat. No. 4,103,267 "HYBRID TRANSFORMER DEVICE", issued July 25, 1978 by Olschewski illustrates the closest prior art. The hybrid transformer device disclosed therein has been widely used by the assignee in commercially marketed hybrid integrated circuit isolation amplifiers and DC to DC converters. Although highly successful commercially, there have been several problems which reduce the yield and performance of the hybrid integrated circuits containing the toroidal hybrid integrated circuit transformer described in the Olschewski patent One problem is that the maximum practical number of primary and secondary windings is considerably less than desirable, and hence the primary and secondary inductances are lower than desirable. The low primary inductance requires that a relatively large primary current be driven into the primary winding, necessitating use of a more expensive driver transistor having higher current capability than would be desirable. The high current level required results in increased cost and reduced reliability of products incorporating the toroidal hybrid IC transformer of the Olschewski patent.

Another more severe problem is that when the maximum permissable number of turns are provided in the primary winding and secondary winding, so as to provide adequate primary winding inductance and/or adequate amplification of the signal applied to the primary winding, the conductors at the extreme ends of the primary and secondary winding are only 10 mils apart. This short 10 mil gap has resulted in a severe problem of electrical arcing between the primary and secondary windings. Furthermore, the maximum total number of turns, including primary winding turns and secondary winding turns, is only 39 for the toroidal ferrite cores used which have an inside diameter of 197 and an outside diameter of 375 mils. Often, it would be desirable to have considerable more than 39 total turns to achieve adequate primary winding inductance and/or adequate voltage amplification.

Despite use of a very expensive dielectrical material commercially available from DuPont under the trade name PARYLENE, and despite use of the various DI (deionized water) rinses and alcohol cleaning steps to remove all possible ionic contamination before coating the substrate with PARYLENE dielectric coating, product failures due to electrical arcing at the adjacent end points of the primary and second windings has been a continuing source of difficulty, limiting the manufacturing yields, increasing the cost, and limiting the voltage breakdown specifications of the DC to DC converter and isolation amplifier products using the Olschewski toroidal transformer.

It would be very desirable to provide improved toroidal transformer that is as "process-compatible" with conventional hybrid integrated circuit manufacturing processes as the Olschewski device, but does not require the large primary drive currents required by the Olschewski hybrid transformer, has a substantially higher manufacturing yield, lower cost higher product reliability much higher isolation breakdown voltages than the Olschewski hybrid-transformer.

Apparently, up to now, no one has thought of providing a square hybrid integrated circuit of the general type disclosed in the Olschewski patent, even though transformers with unitary square ferrite cores have been widely used in other applications, because there was no recognition in the art that use of a miniature square toroidal transformer could be practical and lead to great advantage in high voltage microelectric products such as isolation amplifiers and DC to DC converters.

Instead, the state-of-the-art in hybrid integrated circuits has either been to use the round ferrite toroid hybrid integrated circuit transformer device disclosed in the Olschewski reference or to use "hand-wound" round toroidal transformer devices. The hand-wound round toroidal transformers generally have been composed of two U-shaped or E-shaped ferrite core sections serving as "bobbins" upon which the primary and secondary turns, consisting entirely of wire, have been wound. An unwieldy clip arrangement has been provided to secure the two halves of the ferrite core tightly together. Very precisely machined "half-core" end surfaces have been provided to fit precisely together to minimize gaps between the "end" portions of such "half-cores". High voltage products using such toroidal transformer devices have proven impractical due to their cost or to the above-mentioned arcing between closely spaced end portions of the primary and secondary windings. In order to achieve the above-mentioned 39 turns of the Olschewski hybrid transformer, it has been necessary to provide only 6 to 7 mil center-to-center spacing between the wire bonds forming portions of each turn. This center-to-center spacing requires that the 3 mil wide metalization strips be spaced only approximately 3 to 3.5 mils apart. Such a close spacing severely presses the present state-of-the-art, and reduce the manufacturing yields more than is really acceptable.

Square transformers have been commonly used in applications other than microelectronics, however. Frequently, square transformers have been composed of separate core sections constituting "bobbins" on which the primary and secondary windings are respectively wound. These core sections then are attached at their end points by additional core sections of the same material, forming a square toroid structure. These devices usually have been utilized in low isolation voltage applications. The square core configurations, however, have not been provided to increase the minimum spacing between conductors of the primary and secondary windings, but merely for convenience of manufacture.

It is noteworthy there have been relatively few major changes in hybrid IC fabricating techniquest in recent years. The state-of-the-art is indicated by the above-mentioned Olschewski patent, Japanese Patent Public Disclosure No. 48-22737 issued Mar. 15, 1973, U.S. Pat. Nos. 3,104,377, 3,675,095, 3,764,938, 4,188,651, U.K. Patent Nos. 811,295 and 1,469,944 and German Patent Nos. 1,197,561 and 2,723,363.

There is a continuing need for an improved transformer of the general type described in the Olschewski patent which provides increased inductance, and much less subject to failure due to electrical arcing between the primary and secondary windings, does not introduce new difficulties into the manufacturing process, and simplifies the prior manufacturing process.

SUMMARY OF THE INVENTION

Accordingly, it is an object of the invention to provide an improved hybrid integrated circuit transformer that can fit into the same sized cavity as the above-described Olschewski transformer is equally compatible with conventional hybrid integrated circuit manufacturing processes, yet substantially increases the number of turns and substantially increases the primary winding inductance.

It is another object of the invention to reduce the amount of primary drive current required in high voltage isolation hybrid integrated circuit products such as isolation amplifiers and DC to DC converters.

It is another object of the invention to improve the manufacturing yield of high voltage components requiring integrated circuit transformers by eliminating failures due to electrical arcing between primary and secondary windings.

It is another object of the invention to simplify the hydbrid integrated circuit manufacturing process for products utilizing transformers.

Briefly described, and in accordance with one embodiment thereof, the invention provides a hybrid integrated circuit transformer device including a ceramic substrate with two groups each including a plurality of planar parallel conductors formed of metalized strips on an insulating substrate. A dielectric layer is provided over intermediate portions of each of the planar conductors, exposing their end points. A rectangular ferrite toroidal core pre-coated with insulating material is adhesively secured to the dielectric layer without coating the substrate with PARYLENE dielectric material in most embodiments of the invention. In the described embodiment of the invention, the two parallel groups of strip conductors are dispensed at a slight angle relative to opposite arm of the toroid. A plurality of wire bonding conductors are bonded at one end of the respective strip conductors of the first group and looped over an arm of the toroid and bonded to the opposite end of an adjacent one of the strip conductors of the first group in a plane normal to the axis of one leg of the rectangular ferrite core to form a primary winding with a large number of turns. The secondary winding is similarly formed on an opposite arm of the rectangular ferrite core, providing a large number of secondary windings, all of which are separated from each other by a distance equal to the length of the remaining two arms of the rectangular ferrite core. The length of the remaining two arms of the ferrite core are sufficiently great to provide a high degree of isolation and thereby prevent electrical arcing between the primary and secondary windings without use of PARYLENE dielectric coating on the substrate for breakdown voltage ratings up to about 1500 volts AC, the remaining two arms of the toroid also are long enough to provide adequate room for the capillary of a wire bonding machine to move back and unspool a sufficient length of bonding wire to loop over an arm of the rectangular ferrite core and perform the above described bonding to an opposite end of an adjacent strip conductor on the ceramic substrate.

DESCRIPTION OF THE INVENTION

Figure 1:
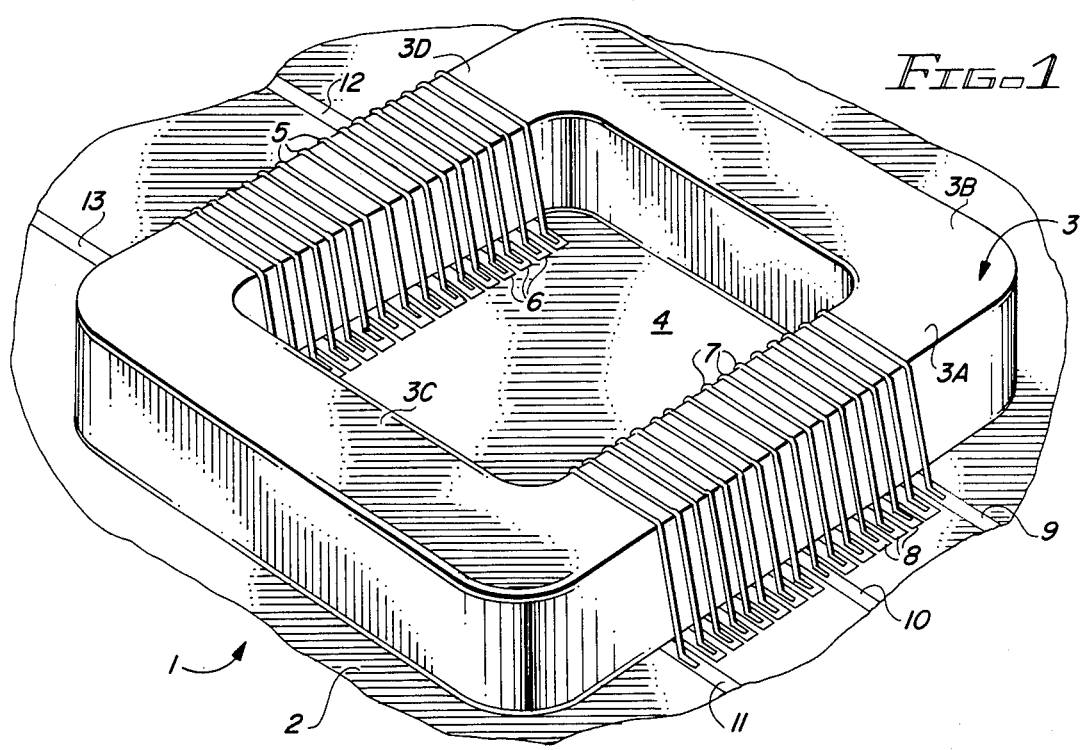
FIG. 1 is a partial perspective view illustrating the square toroid transformer of the present invention.

Referring now to the drawings, hybrid integrated circuit transformer 1 includes a square ferrite toroid 3 disposed on a ceramic substrate surface 2. Toroid 3 includes four "arms" 3A, 3B 3C and 3D. A plurality of metal strip conductors 6 are disposed on substrate 2 under arm 3D of toroid 3 to provide the lower portions of a plurality of primary winding turns of the transformer 1. Similarly, a plurality of spaced metal strip conductors 8 are disposed on substrate 2 under arm 3A to form the lower portions of a plurality of secondary winding turns.

Figure 4:
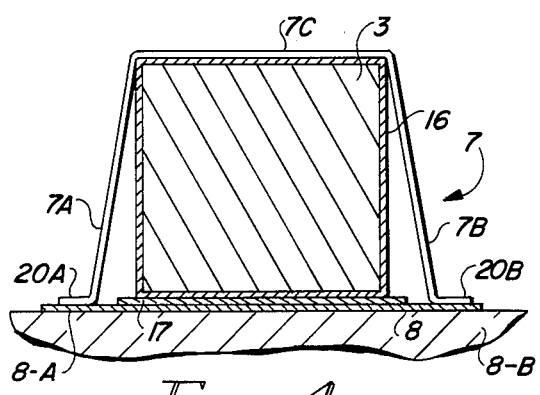
FIG. 4 is a section view along section line 4—4 of FIG. 3.

As best seen in the cross-section view of FIG. 4, ferrite toroid 3 is coated with an insulative coating 16. Preferably, a layer of insulator 17 covers all of the strip conductors 6 and 8 except the extreme end portions, to further insulate them from ferrite toroid 3.

Figure 2:
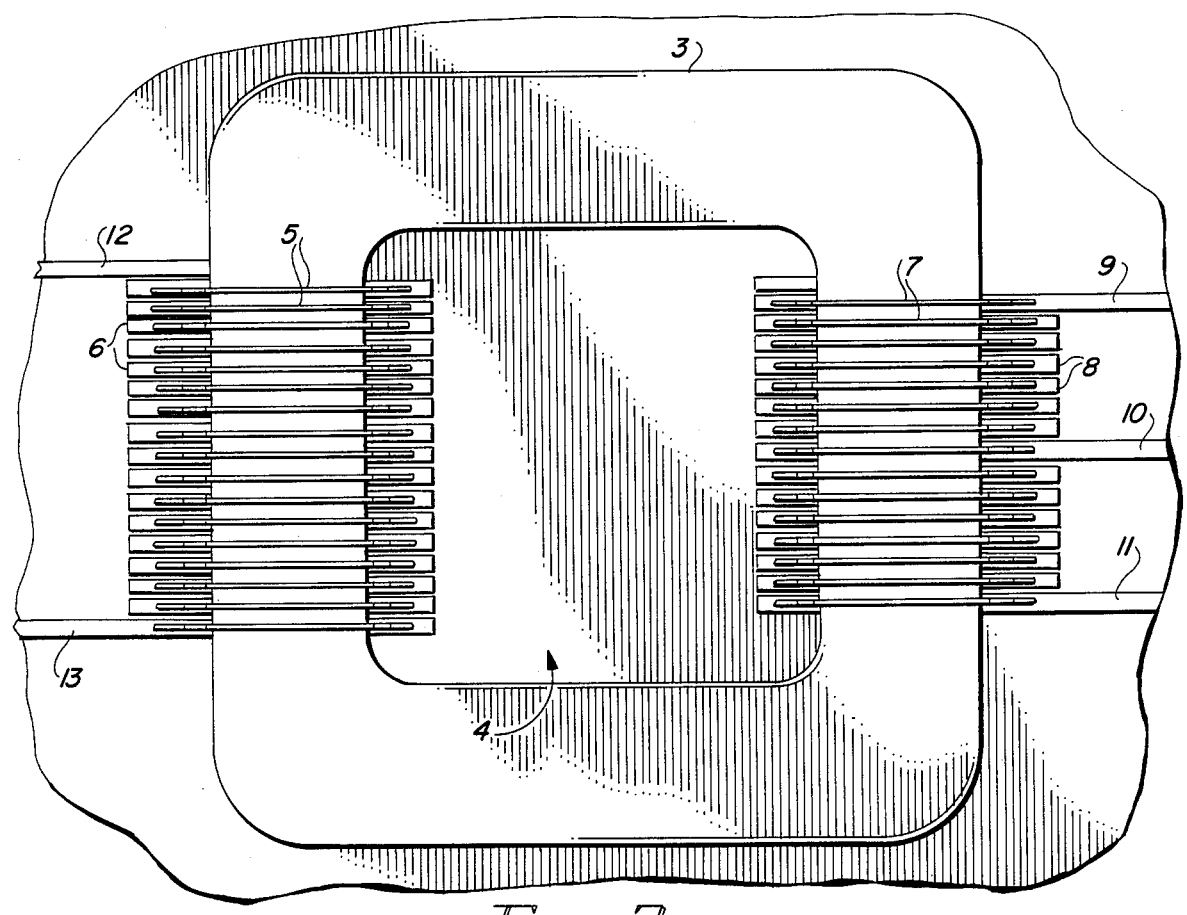
FIG. 2 is a top view of the square toroid transformer of FIG. 1.

The primary winding includes "lead in" conductors 12 and 13 which are integral with the outermost strip conductors 6 of the primary winding, as best seen in FIG. 2.

The primary winding also includes a plurality of bonding wire loops 5, each of which has its left end "stitch bonded", i.e., wire bonded to one of the exposed left end portions of one of the strip conductors 6. The right end of each bonding wire loop 5 is ball bonded to the exposed right end portion of an adjacent one of the strip conductors 6.

Similarly the secondary winding is composed of the strip conductors 8. Two "lead in" conductors 9 and 11 are integral with the outermost strip conductors 8, and a center tap conductor 10 is integral with an intermediate one of the strip conductors 8. Each turn of the secondary winding also includes a bonding wire 7 that loops over the square toroid 4 and is bonded at opposite ends to the exposed end portions of adjacent strip conductors 8.

Each of the bonding wire loops lies flat across the top of the toroid 3. Each bonding wire loop also includes 2 steeply sloped "legs" the bottom ends of which are ball and stitch bonded to exposed ends of separate adjacent conductive strips 8. For example, in FIG. 4, bonding wire loop 7 includes a left sloped leg 7A, the bottom of which is ball bonded at 20-A to a left end 8-A of one of the strip conductors 8. The intermediate portion 7C of bonding wire loop 7 lies across the top of toroid 3. The right hand portion 7B is steeply sloped down from the end of section 7C to stitch bond 20B which is attached to right end of an adjacent one of strip conductors 8.

Figure 3:
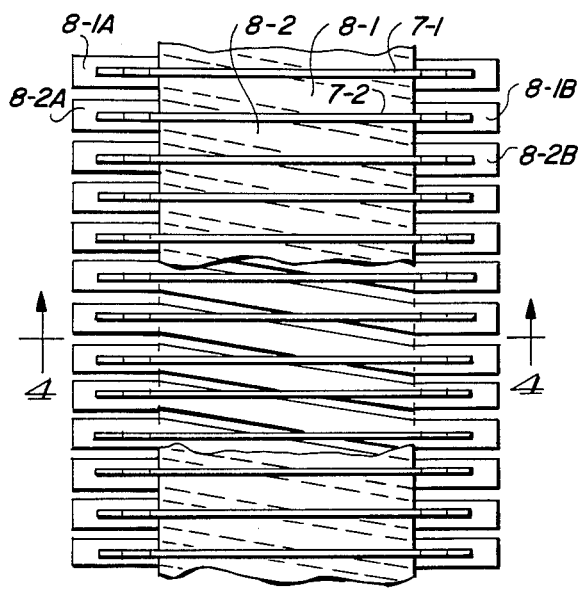
FIG. 3 is a partial cutaway top view of the square toroid transformer of FIG. 1.
Figure 5:
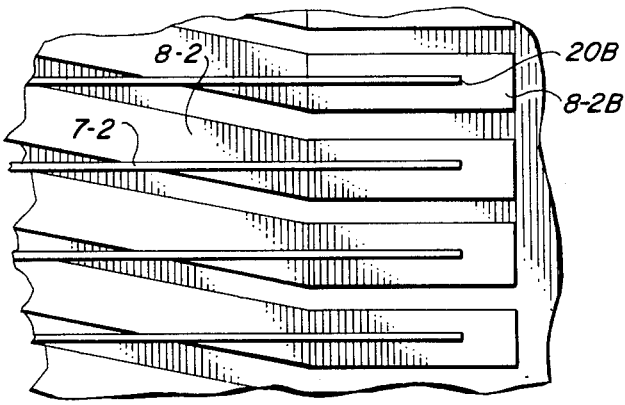
FIG. 5 is an enlarged plan view of a cutaway portion of the square toroid omitting the core but showing the bonding wires and strip conductors.

As best shown in FIGS. 3 and 5, the intermediate portion of each of the strip conductors 8 (and also strip conductors 7) is slightly inclined (in the plane of substrate 2) relative to the leg of toroid 3 around which the windings are formed. For example, strip conductor 8-1 has its right exposed end portion 8-1B at the same level as the exposed left hand portion 8-2A of the adjacent strip conductor 8-2. Bonding wire loop 7-2 is ball bonded at its left end to exposed end portion 8-2A of strip conductor 8-2, and the right end of bonding wire loop 7-2 is stitch bonded to the exposed end portion or pad 8-1B of strip conductor 8-1. All of the other turns of both the primary winding and the secondary winding of transformer 1 are similarly formed.

As best seen in FIGS. 3 and 5, the exposed end bonding pad portions of each of the strip conductors are shown as horizontal and parallel to the bonding wire loop that is stitched to that bonding pad. The intermediate inclined portions such as 8-2 in FIG. 5 are slightly sloped in the plane of the substrate 2.

As shown in the drawings, each of the bonding wire loops lies in a plane that is precisely perpendicular to a longitudinal axis of the arm of toroid 3 about which the winding is formed. It is important that the bonding wire loops rather than the strip conductors be precisely perpendicular to the axis of an arm of the toroid in order to avoid "rolling" of the bonding wire loops 5 and 7 along an upper edge of the ferrite toroid 3. Such rolling could eventually cause electrical shorting between adjacent bonding wire loops, reducing the inductance of the winding.

Figure 6:
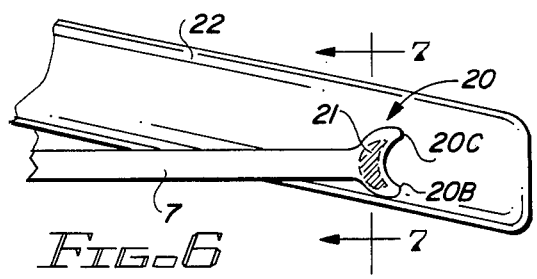
FIG. 6 is an enlarged diagram illustrating an improper wire bond.
Figure 7:
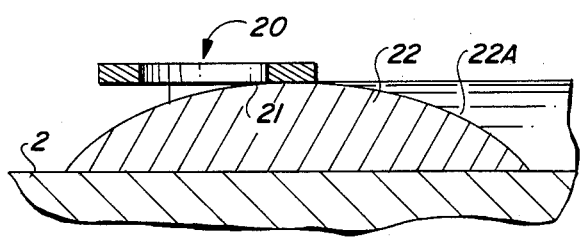
FIG. 7 is a section view along section line 7—7 of FIG. 6.

It has been found to be highly desiable to stitch bond the ends of wire bonding loops 5 and 7 to pad portions of the strip conductors that are parallel, rather than "inclined" to the bonding wire loops. FIGS. 6 and 7 illustrate why this is the case. In FIG. 6, bonding wire loop 7 is stitch bonded to the "inclined" bonding pad portion of an inclined strip conductor 22. Those skilled in the art know that typical thermocompression wire bonding capillaries tend to split the end of a bonding wire, as indicated by split ends 20B and 20C of stitch bond 20B. Dotted line 21 indicates the portion of the stitch bond at which the electrical contact to the metal bonding pad should is made, this being the area at which the maximum pressure is applied by the thermocompression bonder capillary or needle through which the bonding wire is fed.

Figure 8:
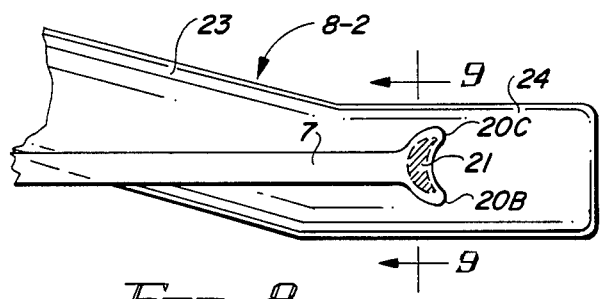
FIG. 8 is an enlarged view of the end of one of the strip conductors of FIG. 1 showing a proper wire bond.
Figure 9:
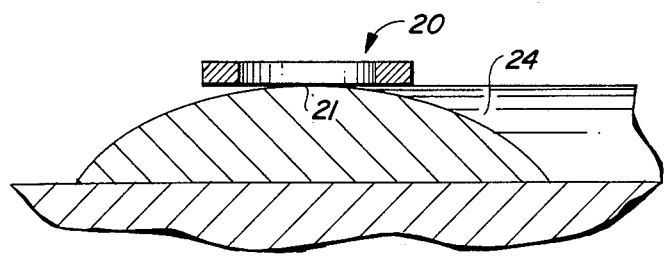
FIG. 9 is a section view along section line 9—9 of FIG. 8.

In FIG. 7, which shows a section view through the electrical contact area 21, it is seen that the upper surface 22A of the bonding pad portion of strip conductor 22 actually is somewhat dome-shaped. Consequently, if the effective stitch bonding area 21 is not precisely centered on the curved upper surface of strip conductor 22, the effective bonding area may be reduced due to such curvature. However, if the bonding pad areas are parallel to the bonding wire loop 7 as shown in FIG. 8, misalignment of the effective bonding area 21 is much less likely to occur, as shown in FIG. 9, when a bonding pad end portion 24 of an inclined strip conductor 23 is parallel to the bonding wire loop 7.

The above described structure is even more easily compatible with hybrid integrated circuit processes than the above mentioned Oleschewski U.S. Pat. No. 4,103,267, commonly assigned and issued July 25, 1978, and incorporated herein by reference. The strip conductors 6 and 8 can be composed of gold approximately 0.6 mils thick and 7 mils wide, as is conventional. The strips can be spaced 7 mils apart. If the dimensions of the aperture 4 of the ferrite toroid 3 are 0.5 inches by 0.5 inches, then as many as 32 turns can be easily provided on the primary winding and/or the secondary winding far more than is the case for a round toroid occupying the same substrate area.

The substantially larger number of turns for the primary or secondary winding result in very high input inductance, which is highly desirable because it substantially reduces the peak drive current requirements for the primary winding allowing smaller lower power, lower cost drive current transistors to be utilized.

An important advantage of the above described structure is that there is no need to utilize a coating of PARYLENE insulative material on any portion of the structure except the toroid itself unless the breakdown voltage rating is in excess of 1,500 volts A.C. Furthermore, the intensive cleaning steps prior to application of a layer of PARLENE are unnecessary. The benefits of much higher primary to secondary breakdown voltage high primary winding impedence large "step up" voltages, and overall higher reliability have been achieved by providing the square toroid transformer of the present invention in the same size cavity as is required to accommodate the prior round toroid transformer. In some instances the square opening 4 eases the task of manipulating the wire bonding head therein.

The provision of the hybrid integrated circuit transformer of the present invention allows reliable high voltage D.C. to D.C. converters and isolation amplifiers to be manufactured at lower cost than has been previously attainable by making it possible to provide a total number of 64 windings on a square toroid on a 0.74 inch square substrate area, whereas the maximum number of windings that can be provided using a round toroid is 37. The minimum spacing between the resulting primary and secondary windings for a round toroid is only 7.5 mils, which leads to the above mentioned electrical arcing problem and component failures. For the present invention, the primary-to-secondary winding spacing is 400 mils. If the permativity, cross-sectional area, and magnetic path lengths are the same, the square toroid transformer has approximately three times the inductance of the round toroid transformer.

While the invention has been described with reference to a particular embodiment thereof, those skilled in the art will be able to make various modifications to the described embodiment without departing from the true spirit and scope of the invention. It is intended that all devices and processes which are equivalent to those in that they perform substantially the same function in substantially the same way to achieve the same result are within the scope of the invention.

I claim:

1. A hybrid transformer device for use in a hybrid integrated circuit, comprising in combination:
   (a) a nonconductive substrate having a planar surface;
   (b) first and second groups of parallel metal strip conductors adherent to the planar surface, each having an inner end and an outer end;

(c) dielectric material on intermediate portions of each of the strip conductors between the inner and outer ends thereof, the inner and outer ends extending beyond the dielectric material;

(d) a unitary rectangular magnetic core coated with dielectric material and having only first, second, third and fourth arms forming a continuous closed rectangular toroid, the first and third arms being parallel and the second and fourth arms being parallel, the first group of strip conductors being under the first arm and the second group of strip conductors being under the third arm;

(e) a layer of adhesive material bonding the rectangular magnetic core to the dielectric material above the strip conductors; and (f) a first group of bonding wire conductors looping over the first arm and having first and second ends wire bonded to an outer end of a strip conductor of the first group and an inner end of an adjacent strip conductor of the first group, respectively, forming a primary winding, and a second group of bonding wire conductors looping over the third arm and each having first and second ends wire bonded to an inner end of a strip conductor of the second group and an outer end of an adjacent strip conductor of the second group, respectively, forming a secondary winding.

2. The hybrid transformer device of claim 1 wherein the rectangular magnetic core is ferrite and the strip conductors are gold and the bonding wire is gold.

3. The hybrid transformer device of claim 1 wherein each of the wire bonds lies in a respective plane perpendicular to a longitudinal axis of the first arm of the rectangular magnetic core.

4. The hybrid transformer device of claim 3 wherein each of the strip conductors is approximately 7 mils wide and the spacing between each of the adjacent strip conductors of the first group is approximately 7 mils and the spacing between each of the adjacent strip conductors of the second group is approximately 7 mils.

5. The hybrid transformer device of claim 4 wherein the inside dimensions of the magnetic core are 0.5 inches by 0.5 inches and the outside dimensions are 0.7 inches by 0.7 inches.

6. The hybrid transformer device of claim 3 wherein each of the strip conductors has two exposed end portions that are coplanar with the bonding wire loops respectively bonded thereto and also has a midportion inclined relative to the planes of the bonding wire loops, to improve the reliability of the wire bonds.

* * * * *